United States Patent [19]
Tanaka

[11] Patent Number: 5,594,248
[45] Date of Patent: Jan. 14, 1997

[54] INFRARED IMAGING DEVICE AND INFRARED IMAGING SYSTEM USING SAME

[75] Inventor: Akio Tanaka, Tokyo, Japan

[73] Assignee: NEC Corporation, Japan

[21] Appl. No.: 615,013

[22] Filed: Mar. 12, 1996

Related U.S. Application Data

[63] Continuation of Ser. No. 201,207, Feb. 24, 1994, abandoned.

[30] Foreign Application Priority Data

Feb. 25, 1993 [JP] Japan .................................. 5-035930

[51] Int. Cl.$^6$ ...................................................... H04N 5/33
[52] U.S. Cl. .......................................................... 250/332
[58] Field of Search ........................ 250/332, 349, 250/338.1, 339.02; 257/444, 445

[56] References Cited

U.S. PATENT DOCUMENTS 5,101,271  3/1992  Andrews et al. ...................... 250/332
5,276,319  1/1994  Hepfer et al. ........................ 250/332

FOREIGN PATENT DOCUMENTS 56-064570  6/1981  Japan .
1188965  8/1986  Japan .
1062977  3/1989  Japan .
2181020  9/1986  United Kingdom .
88/01793  3/1988  WIPO .

OTHER PUBLICATIONS

Choi, I. H., et al., *Transducers '85, 1985 International Conference on Solid–State Sensors and Actuators*, "A Linear Thermopile Infrared Detector Array with On–Chip Multiplexing", 85CH2127-9, 1985, pp. 132–135. No month.

Lenggenhager, R., et al., *IEEE Electron Device Letters*, "Thermoelectric Infrared Sensors by CMOS Technology", vol. 13, No. 9, Sep. 13, 1992, pp. 454–456.

*Primary Examiner*—David P. Porta
*Assistant Examiner*—Richard Hanig
*Attorney, Agent, or Firm*—Ostrolenk, Faber, Gerb & Soffen, LLP

[57] ABSTRACT

An infrared imaging device has a plurality of detectors comprising thermocouples, bolometers, or the like and a scanner for scanning the detectors. To prevent all pixels corresponding to the detectors from failing to operate due to a charge overflow that occurs when some of the detectors are broken, a bypass circuit in the form of a bypass resistor, and a diode, or the like, is connected parallel to each of the detectors for limiting the output signal therefrom to a predetermined voltage range. Even if a detector is broken, the output signal thereof is limited to the predetermined voltage range, thus preventing a charge overflow.

14 Claims, 4 Drawing Sheets

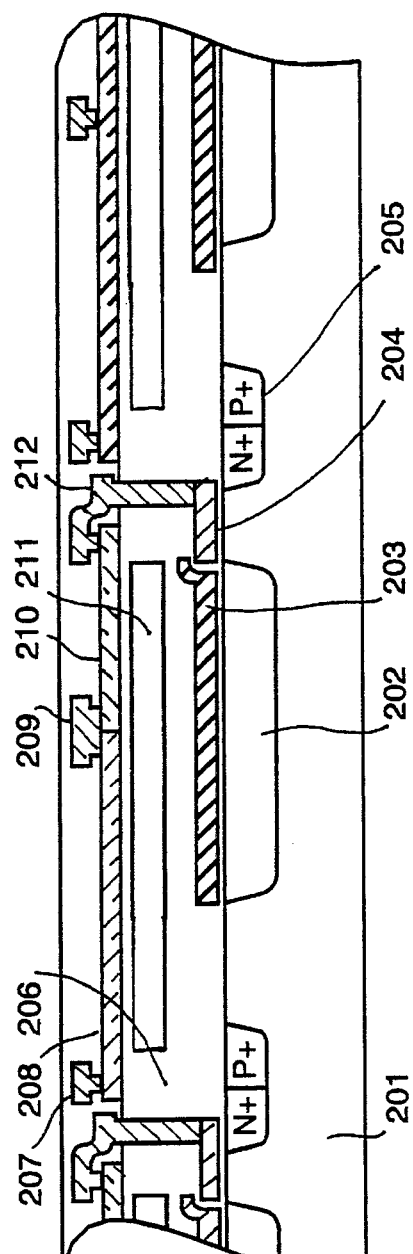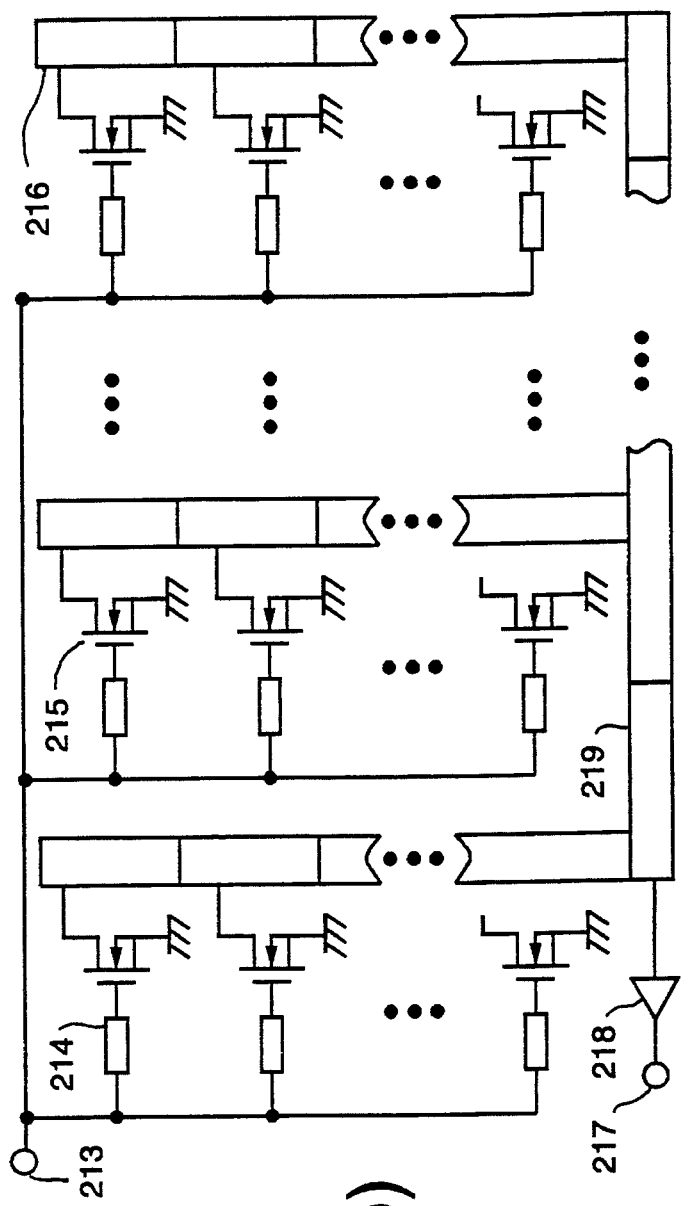
FIG 1(a) PRIOR ART
FIG 1(b) PRIOR ART

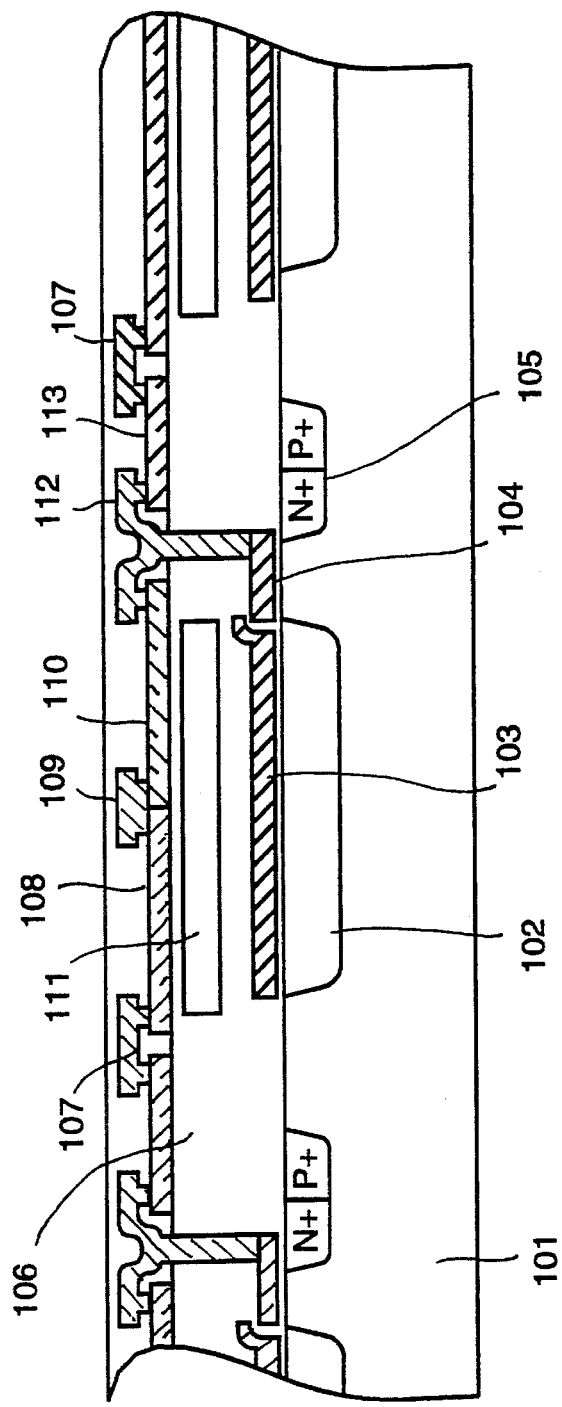
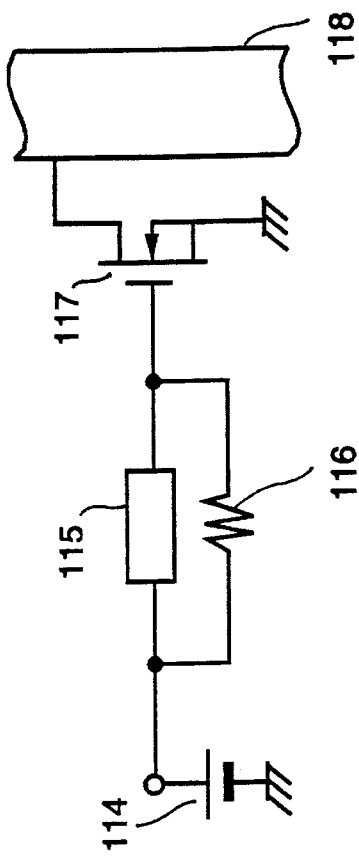
FIG 2 (a)
FIG 2 (b)

INFRARED IMAGING DEVICE AND INFRARED IMAGING SYSTEM USING SAME

This is a Continuation of Application Ser. No. 08/201,207, filed on Feb. 24, 1994 now abandoned.

BACKGROUND OF THE INVENTION

1. Field of the Invention

The present invention relates to an infrared imaging device and an infrared imaging system using such an infrared imaging device, and more particularly to an infrared imaging device which includes a detector comprising a thermocouple, a bolometer, or the like and a scanner comprising a charge-coupled device (CCD) or the like, and an infrared imaging system for outputting an image signal which is detected by such an infrared imaging device.

2. Description of the Prior Art

As shown in FIG. 1(a) of the accompanying drawings, a conventional thermal infrared imaging device includes both a detector comprising a thermocouple composed of a P-type polysilicon layer 208, a hot contact 209, and an N-type polysilicon layer 210, and a scanner comprising a CCD composed of an N-type well 202 and a CCD electrode 203 and a readout gate 204 and a source 205 for supplying a current to the CCD in response to a signal from the detector. The scanner is fabricated in a P-type semiconductor substrate 201 with an oxide film 206 deposited thereon by chemical vapor deposition (CVD), the oxide film 206 having a cavity 211 defined therein. The thermocouple is deposited on the oxide film 206 across the cavity 211. The cavity 211 is produced by forming a polysilicon layer (sacrificial layer) in the oxide film 206 where the cavity 211 is to be defined, and then etching away the polysilicon layer. The detector and the scanner are arranged in the vertical columns and horizontal rows of a two-dimensional pattern as an infrared imaging device as shown in FIG. 1(b).

The infrared imaging device shown in FIGS. 1(a) and 1(b) operates as follows: A certain bias voltage $V_B$ is applied to a bias voltage terminal 213 to operate readout transistors 215, which are each composed of a readout gate 204 and the source 205, in a suitable fashion. Infrared radiation applied from above in FIG. 1(a) is absorbed by a pellet surface, making the temperature of a thin-film area, i.e., the hot contact 209, above the cavity 211 higher than the temperature of the other area. A bias voltage line 207 and a contact 212 correspond to a cold contact of the thermocouple, and are positioned outside the thin film. Therefore, any heat applied to the bias voltage line 207 and the contact 212 is transferred to the substrate, resulting in substantially no temperature rise at the bias voltage line 207 and the contact 212.

Because of the difference between the temperatures at the hot and cold contacts, an electromotive force is generated due to the Seebeck effect, and added to the bias voltage $V_B$, which is then applied to the readout gate 204 of the readout transistor 215. The voltage applied to the readout gate 204 modulates an electron flow from the source 205 to the N-type well 202 corresponding to a vertical CCD 216, which stores electric charges for a certain period of time. The electric charges stored in the vertical CCD 216 of each pixel as shown in FIG. 1(b) are successively transferred to horizontal CCDs 219 by the charge transfer operation of the CCDs, and then supplied through an on-chip amplifier 218 to an output terminal 217. The output terminal 217 supplies an output signal representative of the amount of infrared radiation incident on each pixel for thereby producing a two-dimensional infrared image.

An infrared imaging system which employs the infrared imaging device of the above structure includes a CCD driver for outputting drive signals to enable the CCDs to transfer the stored electric charges, and an amplifier for amplifying the signal supplied from the output terminal 217.

For increasing the sensitivity of the conventional infrared imaging device, it is necessary to reduce the thickness of the thin-film area, i.e., diaphragm, over the cavity 211 for thereby prevent the heat from being drained. The thickness and width of the P-type polysilicon layer 208 and the N-type polysilicon layer 210 have to be reduced because their thermal conductivity is relatively high. If the oxide film 206 has a small film thickness, it tends to develop pinholes, potentially causing the P- and N-type polysilicon layers 208, 210 to break when the polysilicon layer is etched away to produce the cavity 211, and also causing some diaphragms to deform and break owing to different fabrication process conditions.

The breakage of the thermocouple of even one pixel opens the gate of the corresponding readout transistor 215, allowing a number of electrons to flow into the vertical CCD and then to overflow successively into surrounding pixels until the infrared imaging device stops functioning.

Therefore, the breakage of the thermocouple of a single pixel is fatal because it results in the failure of all pixels. Such a phenomenon manifests itself when efforts are made to increase the sensitivity of the infrared imaging device, and hence is the greatest obstacle to increasing the sensitivity of the infrared imaging device.

SUMMARY OF THE INVENTION

It is therefore an object of the present invention to provide an infrared imaging device which is capable of avoiding a charge overflow that would otherwise cause all pixels to fail even when a thermocouple is broken, and hence which can be manufactured with a high yield, and an infrared imaging system for outputting a high-quality image signal by complementing image data from a defective pixel with image data from surrounding pixels based on an image signal detected by such an infrared imaging device.

According to the present invention, there is provided an infrared imaging device comprising a plurality of detectors for converting infrared radiation into an electric signal, each of the detectors comprising an infrared radiation detecting device and a readout transistor connected thereto, and a scanner for scanning output signals respectively from the detectors and producing a signal representing the scanned output signals, each of the detectors including a bypass circuit for limiting the output signal from the detector within a fixed voltage range when the infrared radiation detecting device thereof is broken.

The bypass circuit may comprise a resistor or a rectifier having a terminal connected to a voltage source for producing the fixed voltage, or a transistor capable of switching periodically.

According to the present invention, there is also provided an infrared imaging system including such an infrared imaging device, for generating and outputting an infrared image signal from the output signals from the detectors, the infrared imaging system comprising defective pixel detecting means for identifying the positions of pixels corresponding to those detectors which have inoperative infrared radiation detecting devices, and complementing means for complementing image data produced by the pixels whose positions are identified by the defective pixel detecting means, with image data produced by pixels surrounding the pixels.

The above and other objects, features, and advantages of the present invention will become apparent from the following description when taken in conjunction with the accompanying drawings which illustrate preferred embodiments of the present invention by way of example.

BRIEF DESCRIPTION OF THE DRAWINGS

FIG. 1(a) is a partial cross-sectional view of a conventional infrared imaging device;

FIG. 1(b) is a partial equivalent circuit diagram of a conventional infrared imaging system using infrared imaging devices as shown in FIG. 1(a);

FIG. 2(a) is a partial cross-sectional view of an infrared imaging device according to a first embodiment of the present invention;

FIG. 2(b) is a partial equivalent circuit diagram of the infrared imaging device shown in FIG. 2(a);

DETAILED DESCRIPTION OF THE PREFERRED EMBODIMENTS

Figure 3:
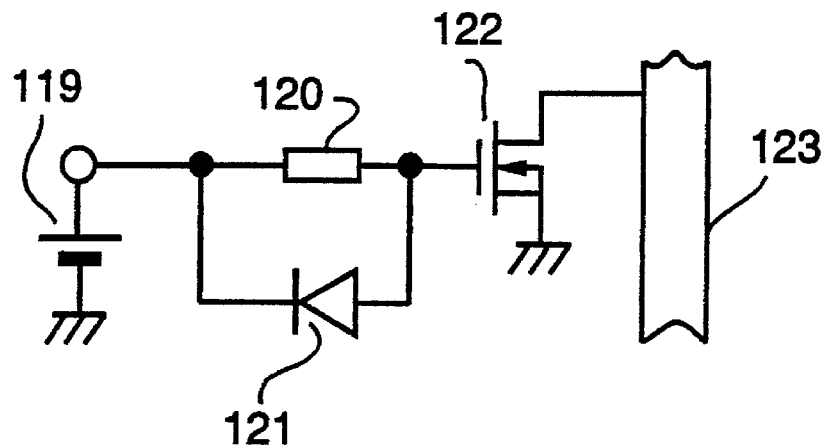
FIG. 3 is a partial equivalent circuit diagram of an infrared imaging device according to a second embodiment of the present invention.

An infrared imaging device according to a first embodiment of the present invention as shown in FIG. 2(a) is fabricated as follows:

First, an N-type well 102 and a source 105 are formed in a P-type semiconductor substrate 101 by photolithography and impurity diffusion techniques. Then, a polysilicon CCD electrode 103 and a readout gate 104 are deposited on the P-type semiconductor substrate 101 by CVD, and an oxide film 106 is deposited thereon by CVD. A polysilicon layer (sacrificial layer) is grown in the oxide film 106 where a cavity 111 is to be formed. The polysilicon layer will subsequently be etched away to produce the cavity 111. Thereafter, a P-type polysilicon layer 108, an N-type polysilicon layer 110, and a bypass resistor 113 are deposited on the oxide film 106, following which bias voltage interconnection 107, a hot contact 109, and a contact 112 are deposited on the surface formed so far as the aluminum electrodes, which are covered with an oxide film as a cover. Finally, through holes are defined which extend from the surface to the sacrificial polysilicon layer, and the sacrificial polysilicon layer is etched away to produce the cavity 111.

FIG. 2(b) is a partial shows an equivalent circuit of the infrared imaging device thus fabricated. The P-type polysilicon layer 108, the N-type polysilicon layer 110, and the bypass resistor 113, which overlie the cavity 111, jointly serve as a thermocouple 115 that is sandwiched between upper and lower thin oxide films, each of which are several thousands Å thick. These thin oxide films or a diaphragm is effective to lower the lateral thermal conductivity and increase the temperature of the hot contact 109 for increased sensitivity. The bias voltage interconnection 107 and the contact 112 correspond to a cold contact and are positioned outside of the diaphragm and maintend at substantially the same temperature as the semiconductor substrate 101. A thermal electromotive force is generated based on the difference between the temperatures at the hot and cold contacts, and added to a bias voltage supplied from a bias power supply 114. The sum voltage is then applied to the readout gate 104 of a readout transistor 117.

The readout transistor 117 is used in a slightly inverted condition in which the drain current varies exponentially with respect to the gate voltage. The bias voltage applied to the readout transistor 117 is selected such that the readout gate 104 is slightly inverted for thereby allowing a bias current and a signal current, which is an amplified thermal electromotive force, to flow. The source 105 injects electrons into the N-type well 102, which corresponds to a vertical CCD 118. The current which has flowed is accumulated (integrated) for a certain period of time, and then transferred to the output terminal of a horizontal CCD. If the diaphragm or oxide film has pinholes and the thermocouple, thereby fails to operater, the readout gate opens and allows a number of electrons to flow into the CCDs, thereby causing all pixels to fail to operate. According to this embodiment, such a problem does not arise because the potential at the gate of the readout transistor 117 is fixed at the bias voltage by a bypass resistor 116 which corresponds to the bypass resistor 113 shown in FIG. 2(a).

As shown in FIG. 2(b), if a thermocouple 115 and a bypass resistor 116 are provided in parallel, thermoelectromotive force generated by the thermocouple 115 will be influenced by the bypass resistor 116. Because the thermoelectromotive force generated by the thermocouple 115 is damped according to the ratio of the resistance value $r_t$ of the thermocouple 115 to the resistance value $r_p$ of the bypass resistor 116, the amount of damping of the thermoelectromotive force generated by the thermocouple 115 will be at a level of 10% if the resistance value $r_p$ of the bybass resistor 116 is in the range of ten times the resistance level $r_t$ of the thermocouple 115, and the amount of damping effected by bypass resistor 116 can be reduced to the extent that the resistance value $r_p$ of the bypass resistor 116 is increased. Increasing the resistance value $r_p$ of the bypass resistor (to greater than 100 MΩ), however, gives rise to defective operation due to noise. It is therefore preferable to make the resistance value $r_p$ of the bypass resistor 116 more than five times the resistance value $r_t$ of the thermocouple 115 without exceeding 100 MΩ, and more preferable to make the resistance value $r_p$ of the bypass resistor 116 more than ten times the resistance value $r_t$ of the thermocouple 115 without exceeding 100 MΩ.

FIG. 3 shows an equivalent circuit of an infrared imaging device according to a second embodiment of the present invention. In the infrared imaging device according to the second embodiment, a bypass diode 121 is connected parallel to a thermocouple 120. The other details of the infrared imaging device according to the second embodiment are the same as those of the infrared imaging device according to the first embodiment. In the second embodiment, when the thermocouple 120 fails to operate, the potential at the gate of a readout transistor 122 is limited to a voltage equal to or lower than the sum of a bias voltage applied by a bias power supply 119 and a forward voltage $V_F$ of the bypass diode 121. Therefore, the failure of all pixels can be prevented.

Figure 4:
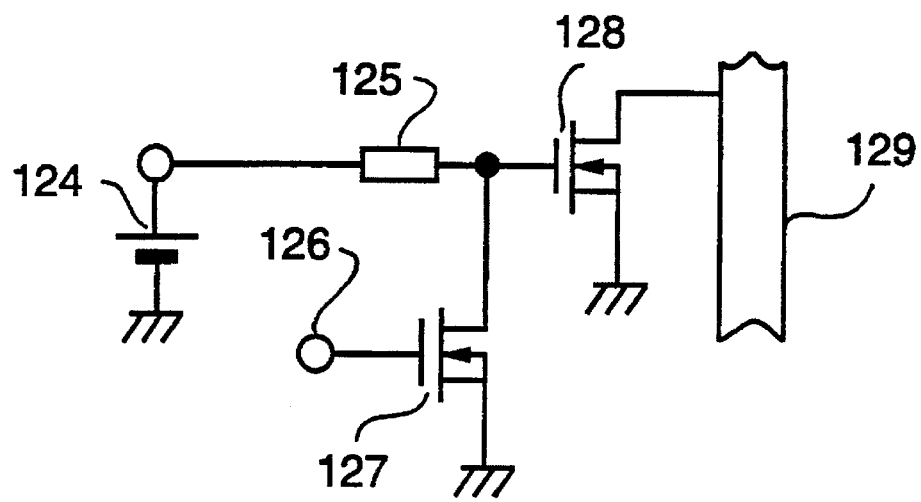
FIG. 4 is a partial equivalent circuit diagram of an infrared imaging device according to a third embodiment of the present invention.

FIG. 4 illustrates an equivalent circuit of an infrared imaging device according to a third embodiment of the present invention. In the infrared imaging device according to the third embodiment, a bypass transistor 127 is connected between the output terminal of a thermocouple 125 and ground. The other details of the infrared imaging device according to the third embodiment are the same as those of the infrared imaging device according to the first embodiment. In the third embodiment, the gate voltage of a readout transistor 128 can be limited within a certain voltage range by periodically switching the bypass transistor 127, for thereby preventing successive of all pixels of the pixels.

Figure 5:
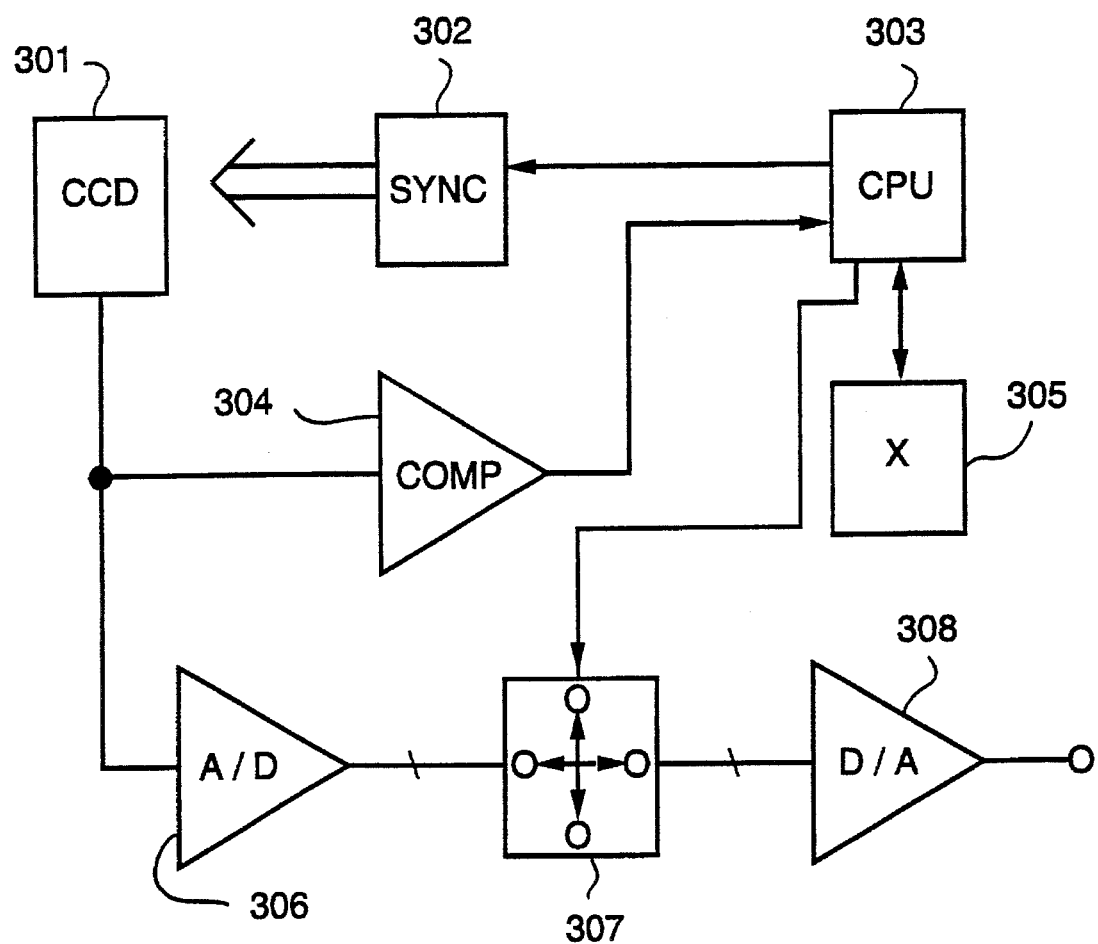
FIG. 5 is a block diagram of an infrared imaging system according to a fourth embodiment of the present invention.

FIG. 5 shows in block form an infrared imaging system according to a fourth embodiment of the present invention, the infrared imaging system employing an infrared imaging device according to the present invention. When a defect occurs in a pixel, a bypass circuit is used to prevent an electron overflow in the infrared imaging device according to the present invention. However, the defective pixel remains as a defect, impairing the quality of a displayed image. Since the potential of a defective pixel is fixed at a constant voltage, it can easily be detected by applying infrared radiation to the entire area of the infrared imaging system and supplying a signal to normal pixels. The infrared imaging system shown in FIG. 5 stores the coordinates of defective pixels and complements image data from those defective pixels with image data from surrounding pixels to thereby producing an image signal that does not greatly differ from a normal image signal.

In FIG. 5, the infrared imaging system includes a CCD 301 as an infrared imaging device, the CCD 301 having a bypass circuit as described above, and a CCD driver 302 for driving vertical arrays of elements and horizontal arrays of transducer elements of the CCD 301 to obtain pixel signals corresponding to the respective transducer elements. Usually, the CCD 301 and the CCD driver 302 alone can produce an infrared image. In this embodiment, however, the infrared imaging system further has a central processing unit (CPU) 303, a comparator 304 for determining a defective pixel, a coordinate memory or defective pixel memory 305 for storing the coordinates of a defective pixel, an analog-to-digital (A/D) converter 306, an image memory 307 for storing image data, and a digital-to-analog (D/A) converter 308.

The CCD 301 supplies an analog output signal representing image data to the A/D converter 306 and the comparator 104. The analog-to-digital converter 306 converts the supplied analog signal into a digital signal, and supplies the digital signal to the image memory 307. The CPU 303 outputs a timing signal to the CCD driver 302, and, responsive to an output signal from the comparator 304, controls write and read operations of the coordinate memory 305 and the image memory 307. The D/A converter 308 converts a digital signal outputted from the image memory 307 into an analog signal and outputs the analog signal as an image signal.

Operation of the infrared imaging system shown in FIG. 5 will be described below. Any defective pixels of the CCD 301 are detected when the infrared imaging system is inspected before being shipped. First, the CPU 303 recognizes a defective pixel detection mode in response to a predetermined signal supplied from an external source. In the defective pixel detection mode, an infrared radiation having a certain intensity is applied to the entire area of the CCD 301. When the CCD 301 is driven, its pixels successively produce respective signals corresponding to the incident infrared radiation. However, any defective pixels where the thermocouple is broken do not produce a signal corresponding to the incident infrared radiation. The comparator 304 determines a pixel as a defective pixel when the difference between the signal produced by that pixel and the signal produced by a normal pixel exceeds a predetermined range. If the comparator 304 determines that a pixel is a defective pixel, it outputs a detected signal to the CPU 303. The CPU 303 identifies the position of the defective signal based on the timing signal supplied to the CCD driver 302 and stores the coordinates of the identified position of the defective pixel in the coordinate memory 305. The coordinate memory 305 comprises a programmable read-only memory (PROM). Any defective pixels of the CCD 301 may be detected only once when the infrared imaging system is inspected. In a usual imaging mode, the CCD 301 supplies image data to the A/D converter 306, and digital image data from the A/D converter 306 are successively stored in the image memory 307. The digital image data stored in the image memory 307 are then read and converted into a normal image signal by the D/A converter 308. The CPU 303 continuously monitors the image data as read from the image memory 307 while referring to the coordinates stored in the coordinate memory 305 to determine whether the coordinates of the read image data correspond to the coordinates of any detected defective pixel that are stored in the coordinate memory 305. If the coordinates of the image data indicate a defective pixel, the CPU 303 generates complementary data by averaging the image data in the image memory 307 from the sorrounding pixels which are above, below, and to the left and right of the defective pixel, and causes the image memory 307 to output the generated complementary data to complement the image data from the defective pixel. Therefore, the infrared imaging system produces a normal image signal that is free of defective image data from defective pixels.

In each of the above embodiments, the infrared radiation detecting devices comprise thermocouples. However, the principles of the present invention are applicable to an infrared imaging device including bolometers or the like as the infrared radiation detecting devices that can be driven by the CCD driver.

As described above, thinning of the diaphragm and the thermocouple for increased sensitivity increases the possibility of inoperative thermocouples. According to the present invention, however, even though some inoperative thermocouples may exist, charge overflow in the imaging device can be avoided,thereby preventing the failure of all the pixels. Infrared imaging device can therefore be manufactured with a high yield.

As an example, the possibility of one thermocouple being inoperative is indicated by a in an infrared imaging device which has a matrix of pixels in X rows and Y columns. Because an infrared imaging device is defective when even one pixel is broken, the usual yield at which infrared imaging device can be manufactured is represented by $(1-a)^{XY}$. Therefore, the yield becomes substantially 0 when a=1/XY, i.e., when one pixel of an infrared imaging device is inoperative. According to the present invention, if the possibility that a bypass circuit is broken is also indicated by a, the yield is represented by $(1-a^2)^{XY}$ because one pixel is defective when both its thermocouple and bypass circuit are inoperative. When a=1/XY, the yield becomes about 1−(1/XY), which is substantially equal to 1. Inasmuch as any defective pixels are detected and the image data thereof are complemented by the image data from surrounding pixels, the infrared imaging system can produce an image that is essentially the same as a normal image. Therefore, the infrared imaging system is highly sensitive, capable of producing a high-quality image, and can be manufactured inexpensively.

Although certain preferred embodiments of the present invention have been shown and described in detail, it should be understood that various changes and modifications may be made therein without departing from the scope of the appended claims.

What is claimed is:

1. An infrared imaging device comprising:

a plurality of detectors for converting infrared radiation into an electric signal, each of said detectors comprising an infrared radiation detecting device and a readout transistor connected thereto; and a scanner for scanning output signals respectively from said detectors and producing a signal representing the scanned output signals;

each of said detectors including a bypass circuit for limiting the output signal from the detector within a fixed voltage range when the infrared radiation detecting device thereof is inoperative.

2. An infrared imaging device according to claim 1, wherein said bypass circuit comprises a resistor having a terminal connected to a voltage source for producing said fixed voltage.

3. An infrared imaging device according to claim 2 wherein the resistance value of the resistor comprised by the bypass circuit does not exceed 100 MΩ, and further, wherein said resistance value is more than five times the resistance value of the corresponding infrared detecting device.

4. An infrared imaging device according to claim 2 wherein the resistance value of the resistor comprised by the bypass circuit does not exceed 100 MΩ, and further, wherein said resistance value is more than ten times the resistance value of the corresponding infrared detecting device.

5. An infrared imaging device according to claim 1, wherein said bypass circuit comprises a rectifier having a terminal connected to a voltage source for producing said fixed voltage.

6. An infrared imaging device comprising:

a plurality of detectors for converting infrared radiation into an electric signal, each of said detectors comprising an infrared radiation detecting device and a readout transistor connected thereto;

a scanner for scanning output signals respectively from said detectors and producing a signal representing the scanned output signal;

each of said detectors including a bypass circuit for limiting the output signal from the detector within a fixed voltage range when the infrared radiation detecting device thereof is inoperative, and wherein said bypass circuit comprises a transistor capable of switching periodically.

7. An infrared imaging system including an infrared imaging device according to claim 1, for generating and outputting an infrared image signal from the output signals from said detectors, comprising:

defective pixel detecting means for identifying the positions of pixels corresponding to those detectors which have inoperative infrared radiation detecting devices; and complementing means for complementing image data produced by the pixels whose positions are identified by said defective pixel detecting means with image data produced pixels surrounding said pixels.

8. An infrared imaging system according to claim 7, further comprising:

a driver for outputting a drive signal to said scanner;

an analog-to-digital converter for converting the output signals from said detectors into digital signals;

an image memory for successively storing the digital signals produced by said analog-to-digital converter; and a digital-to-analog converter for converting digital signals outputted from said image memory into analog signals;

said defective pixel detecting means comprising:

a comparator for comparing the output signal from each of said detectors with a predetermined value and outputting a signal indicative of a defective pixel if the difference between the output signal and said predetermined value falls outside of a predetermined range; and a coordinate memory for storing the coordinates of the defective pixel as indicated by said signal outputted from said comparator;

said complementing means comprising a controller for controlling said driver, said image memory, said comparator, and said coordinate memory to write the coordinates of the defective pixel as indicated by said signal outputted from said comparator into said coordinate memory in response to an external signal representing detection of defective pixels, monitor the digital signals as read from said image memory to determine whether pixels represented by the digital signals as read from said image memory are the defective pixels whose coordinates are stored in said coordinate memory, generate complementary image data from the image data from pixels surrounding the defective pixels and output the complementary image data from said image memory to complement the image data from the defective pixels.

9. A infrared camera element, comprising:

a thermocouple;

a bypass power supply connected to said thermocouple;

a readout transistor having a gate and first and second electrodes, said gate connected to said thermocouple;

a charge coupled device ("CCD") connected to said first electrode of said readout transistor, and said second electrode of said readout transistor connected to a ground; and a bypass circuit having a connection between said gate of said readout transistor and said thermocouple.

10. An infrared camera element according to claim 9, wherein said bypass circuit is a resistor.

11. An infrared camera element according to claim 9, wherein said bypass circuit is a PN diode.

12. An infrared camera element according to claim 9, wherein said bypass circuit is a transistor having one electrode connected to the gate of said readout transistor and to said thermocouple, and another electrode connected to ground.

13. An infrared camera element, comprising: a semiconductor substrate, a CCD disposed on said semiconductor substrate, an MOS transistor connected to said CCD, an oxide film disposed on said semiconductor substrate, and a thermocouple and a resistance element disposed on said oxide film, said thermocouple and resistance element being connected to bias voltage wiring and said MOS transistor being connected to said thermocouple and resistance element by through-holes in said oxide film.

14. An infrared camera element according to claim 13, wherein said thermocouple and resistance element are composed of polysilicon.

* * * * *